(12) United States Patent
Ercan et al.

(10) Patent No.: US 6,738,002 B2
(45) Date of Patent: May 18, 2004

(54) SD-ADC WITH DIGITAL DITHER SIGNAL PROCESSING

(75) Inventors: Ramazan Ercan, Vallaurius (FR); Richard Gaggl, Villach (AT); Jorg Hauptmann, Wernberg (AT); Frederic Pecourt, Mouans-Sartoux (FR); Christian Schranz, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/229,936

(22) Filed: Aug. 28, 2002

(65) Prior Publication Data

US 2003/0112163 A1 Jun. 19, 2003

(30) Foreign Application Priority Data

Aug. 29, 2001 (DE) .......................... 101 42 191

(51) Int. Cl.[7] ............................... H03M 1/20
(52) U.S. Cl. ................. 341/131; 341/143; 341/156; 341/155
(58) Field of Search ................. 341/131, 143, 341/144, 155

(56) References Cited

U.S. PATENT DOCUMENTS

| | | | |
|---|---|---|---|
| 5,010,347 A | 4/1991 | Yukawa | 341/143 |
| 5,073,777 A | 12/1991 | Fukuhara et al. | 341/131 |
| 5,889,482 A * | 3/1999 | Zarubinsky et al. | 341/131 |
| 5,999,114 A * | 12/1999 | Hendricks | 341/131 |
| 6,351,229 B1 * | 2/2002 | Wang | 341/131 |
| 6,426,714 B1 * | 7/2002 | Ruha et al. | 341/143 |
| 6,462,685 B1 * | 10/2002 | Korkala | 341/131 |
| 6,473,019 B1 * | 10/2002 | Ruha et al. | 341/143 |
| 6,583,742 B1 * | 6/2003 | Hossack | 341/143 |
| 6,664,908 B2 * | 12/2003 | Sundquist et al. | 341/143 |

OTHER PUBLICATIONS

Young, C.A. "The Advantages of Strictly Digital Dither," IEE Colloquium on Advanced A/D and D/A Conversion Technique Applications, London, U.K., 1989, pp. 2/1–2/3.

* cited by examiner

Primary Examiner—Michael Tokar
Assistant Examiner—Lam T. Mai
(74) Attorney, Agent, or Firm—Fish & Richardson PC

(57) ABSTRACT

A sigma-delta analog-to-digital converter includes an integrator and a dither signal generator for generating a digital dither signal, and a plurality of comparators for converting an analog signal received from the integrator into an output digital value. A digital logic unit is in data communication with the digital dither signal and the comparators. The digital logic unit is configured to change the output digital value on the basis of the digital dither signal.

7 Claims, 2 Drawing Sheets

SD-ADC WITH DIGITAL DITHER SIGNAL PROCESSING

FIELD OF INVENTION

The invention relates to an SD-ADC (sigma delta analog/digital converter).

RELATED APPLICATIONS

This application claims the benefit of the Aug. 29, 2001 priority date of German patent application 101 42 191.5, the contents of which are herein incorporated by reference.

BACKGROUND

U.S. Pat. No. 5,073,777 describes sigma delta analog/digital converters that operate in parallel with one another with independent dither signal generators. The sigma delta analog/digital converter contains at least one integrator and a comparator or quantizer for the analog/digital conversion of an analog input signal. Furthermore, a dither signal generator for generating a digital dither signal is provided.

U.S. Pat. No. 5,010,347 discloses an analog/digital converter with a high signal-to-noise ratio. The analog/digital converter likewise contains an integrator and a comparator for the analog/digital conversion of an analog input signal. Furthermore, a noise generator for generating a digital noise signal is provided.

Young C. A.: "THE ADVANTAGES OF STRICTLY DIGITAL DITHER" in IEE Colloquium on advances analog/digital and digital/analog conversion technique applications, London, UK, 1989, pages 2/1–2/3, describes the use of a digital dither signal in an analog/digital converter, the digital dither signal being added to the digital circuit regions downstream of the analog/digital converter.

SD-ADC generally exhibit limit cycles (periodic audible free oscillation of the ADC with time constant $\tau_t$), which are perceptible as interference signal in the area primarily in audio applications. Limit cycles occur principally when a constant signal is present at the input of the SD-ADC, or during a transmission intermission in which no audio signal is transmitted (so-called idle tones).

In order to avoid such limit cycles, at suitable points in time, a random signal (dither signal) is fed into the SD-ADC, which signal brings about a certain variance of the input signal and thus reduces the proportion of the interference frequency in the spectrum of the output signal. To date, the dither signal has usually been fed to the SD-ADC in analog form.

FIG. 1 shows a block diagram of a known SD-ADC with analog dither signal feed-in. The SD-ADC illustrated is a two-stage SD-ADC with a feedback loop 6 (second order single loop SD-ADC), with two integrators 1 (only one of which is shown), at whose input an analog signal is present, and a comparator 2. The SD-ADC furthermore comprises a dither signal generator 4 for generating a digital dither signal that, after D/A conversion by means of a dither DAC 10, is added to the analog output signal of the second integrator 1 (addition node 12). The accumulated analog signal is fed to the comparator 2, whose switching threshold is usually 0V. Finally, the comparator outputs a corresponding digital value at its output.

The digital result is buffer-stored in a buffer 11 that is connected to the inputs of the integrators 1 via the feedback path 6. In addition, the digital result is fed to signal processing connected downstream (not shown).

The SD-ADC illustrated has the disadvantage, in particular, that the addition of an analog dither signal generates additional interference that adversely influences the performance of the SD-ADC. Furthermore, the known SD-ADC requires an additional dither DAC that, in today's CMOS technologies, requires a relatively large amount of area and power.

Owing to the proximity of the feed-in of the analog dither signal to a highly nonlinear comparator, the feed-in of the dither signal at this location is particularly critical.

SUMMARY

Therefore, the object of the present invention is to provide an SD-ADC that requires less area and power for the feed-in and processing of dither signals in today's CMOS technologies.

The essential concept of the invention consists in carrying out the feed-in of the dither signal in the digital part of the SD-ADC, in feeding only the analog output signal of the integrator to the comparator, and in reinterpreting or changing the digital result output by the comparator in a manner dependent on the level of the dither signal. This means shifting more functionality into the digital region, since modern CMOS processes enable much smaller digital structures than analog structures.

For this purpose, a plurality of comparators with different switching thresholds are provided, which convert the analog signal fed from the integrator into a digital value. Furthermore, a digital logic unit connected to the output of the comparators is provided, to which the digital dither signal is fed and that changes the digital value output by the comparators in a manner dependent on the level of the dither signal.

In this case, the switching thresholds of the comparators preferably correspond to the possible levels of the dither signal.

The SD-ADC is preferably of fully differential construction, the comparators having positive and negative switching thresholds. In this case, the SD-ADC comprises at least three comparators.

In accordance with a preferred embodiment of the invention, the logic unit firstly checks the output of that comparator whose switching threshold corresponds to the negative dither signal level, and then changes, if appropriate, the bits at the outputs of the comparators with a switching threshold that is smaller in magnitude.

The digital result output by the digital logic unit is preferably fed back to the respective inputs of the integrators.

It has been shown that, for the dither signal processing, it is possible to use very simple comparators whose switching threshold is, in particular, significantly less accurate than in the case of comparators of the quantizer of the SD-ADC.

BRIEF DESCRIPTION OF THE FIGURES

The invention is explained in more detail below by way of example with reference to the accompanying drawings, in which.

DETAILED DESCRIPTION

Figure 1:
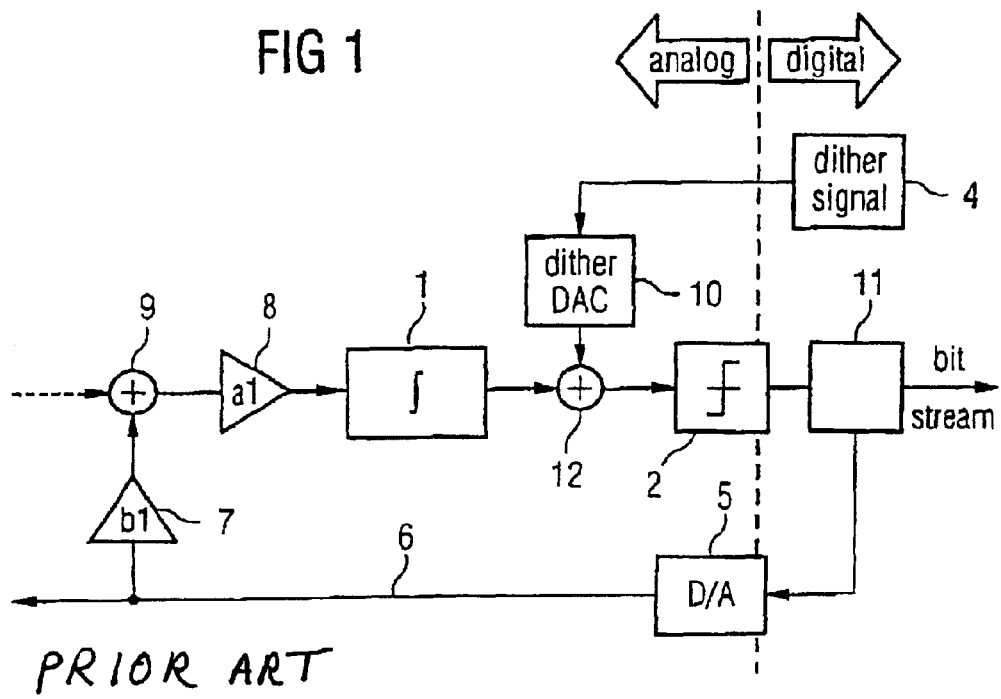
FIG. 1 shows a schematic illustration of a known SD-ADC.

With regard to FIG. 1, reference is made to the explanations in the introduction to the description.

Figure 2:
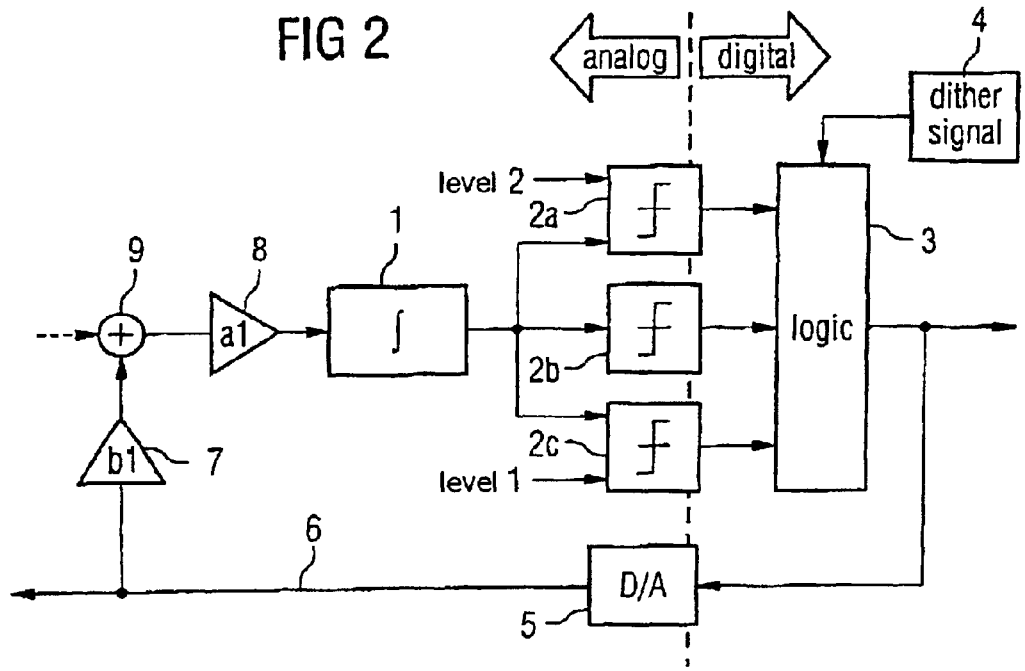
FIG. 2 shows an SD-ADC in accordance with an exemplary embodiment of the invention with three comparators.

FIG. 2 shows a detail from a second-order single-loop SD-ADC with two integrators 1 (only one of which is shown) and three parallel-connected comparators 2a–2c with different switching thresholds (levels 1–3), to which the analog output signal of the integrator 1 is fed. The SD-ADC furthermore contains a dither signal generator 4 for generating dither signals with different levels. In this case, the dither signal generator 4 is connected to logic 3, which is connected to the output of the comparators 2a–2c. Both the digital dither signal and the digital output signal of the comparators 2a–2c are fed to the logic 3.

The logic 3 is now able to change the digital value output by the comparators 2a–2c in a manner dependent on the level of the digital dither signal. In this case, the logic 3 generates a digital value as if the dither signal had been fed to the comparators 2a–2c together with the analog output signal of the integrator 1.

The switching thresholds of the comparators 2a–2c are set to the possible dither signal levels. The method of operation of the logic 3 is explained below using an example:

the dither signal can assume e.g. the levels –1V, 0V, 1V. The switching thresholds (levels 1–3) of the comparators 2a–2c therefore likewise lie at the levels –1V, 0V, 1V (from bottom to top). The analog output signal of the integrator 1 is to be –0.9V. As a result, a digital value "001" (from top to bottom) is established at the output of the comparators 2a–2c. This digital value must now be changed by the logic 3 as if the dither signal has already been added to the analog signal of the integrator 1 upstream of the comparators 2a–2c. In the case of a dither signal of e.g. +1V, a signal of +0.1V would be present in total at the comparators 2a–2c, a digital value "011" being established at the output.

The logic 3 firstly checks the comparator 2c whose switching threshold corresponds to the negative dither signal. On account of the logic "1" at the output of the comparator 2c, the logic 3 recognizes that the signal logic "0" at the output of the comparator 2b must be changed into a logic "1". The logic 3 thus outputs the digital value "1" as the result. (1-bit output signal)

The digital result is converted into analog form by means of a 1-bit D/A converter and fed back to the corresponding inputs of the integrators 1 via a feedback path 6. In this case, the elements 7 and 8 designate parameters of the transfer function of the noise shaping filter that is formed by the integrators 1.

Figure 3:
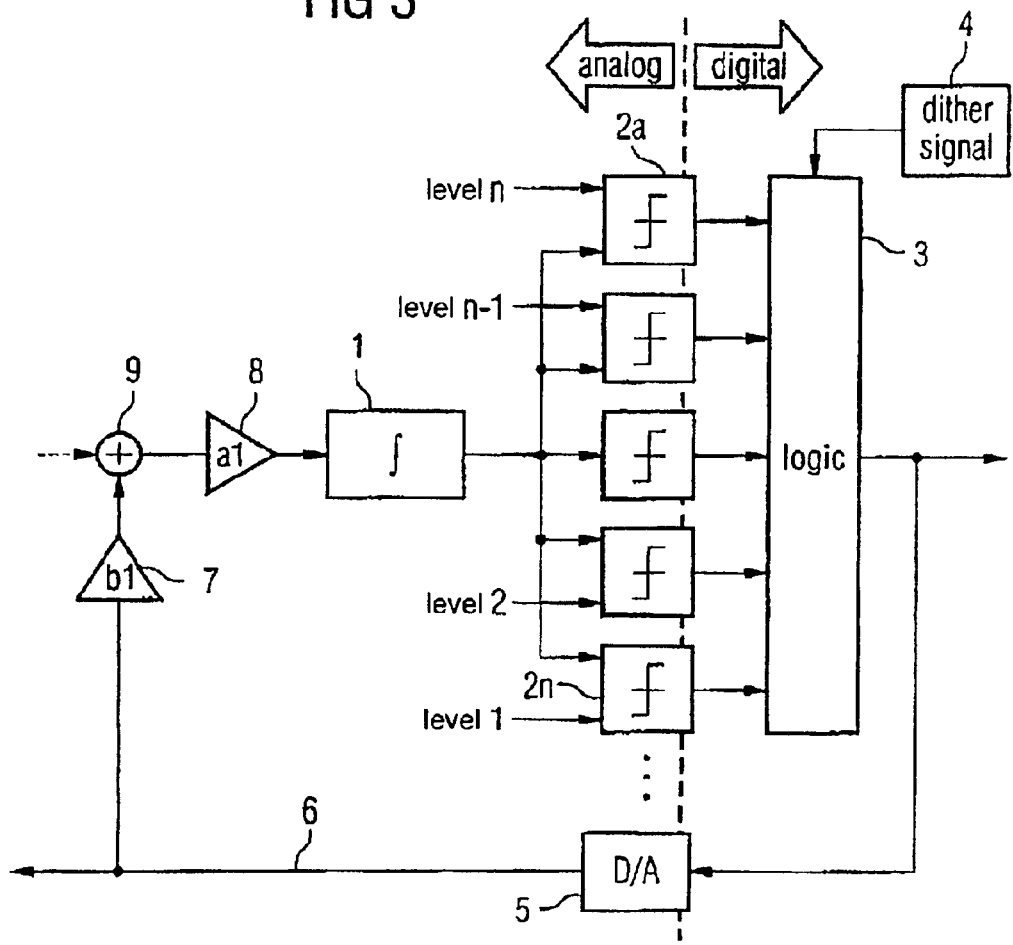
FIG. 3 shows an SD-ADC is accordance with another exemplary embodiment of the invention with the comparators.

FIG. 3 shows the general form of an SD-ADC of FIG. 2 with n comparators 2a–2n and a dither signal generator 4 that is able to generate n different dither signal levels. For the rest, the construction and the functioning of the SD-ADC of FIG. 3 are identical to that of FIG. 2.

What is claimed is:

1. A sigma-delta analog-to-digital converter comprising:
   an integrator;
   a dither signal generator for generating a digital dither signal;
   a plurality of comparators for converting an analog signal received from the integrator into an output digital value, each comparator having a switching threshold that corresponds to a dither signal level; and
   a digital logic unit in data communication with the digital dither signal and the comparators, the digital logic unit being configured to change the output digital value on the basis of the digital dither signal.

2. A sigma-delta analog-to-digital converter comprising:
   an integrator;
   a dither signal generator for generating a digital dither signal;
   at least three comparators for converting an analog signal received from the integrator into an output digital value; and
   a digital logic unit in data communication with the digital dither signal and the comparators, the digital logic unit being configured to change the output digital value on the basis of the digital dither signal.

3. A sigma-delta analog-to-digital converter comprising:
   an integrator;
   a dither signal generator for generating a digital dither signal;
   a plurality of comparators for converting an analog signal received from the integrator into an output digital value, the comparators having positive and negative switching thresholds; and
   a digital logic unit in data communication with the digital dither signal and the comparators, the digital logic unit being configured to change the output digital value on the basis of the digital dither signal.

4. The sigma-delta analog-to-digital converter of claim 1, wherein the plurality of comparators comprises a first comparator having a first switching threshold and a second comparator having a second switching threshold that is less than the first switching threshold, and the digital logic unit is configured to check the second comparator before checking the first comparator.

5. The sigma-delta analog-to-digital converter of claim 4, wherein the second switching threshold has a negative value.

6. A sigma-delta analog-to-digital converter comprising:
   an integrator;
   a dither signal generator for generating a digital dither signal;
   a plurality of comparators for converting an analog signal received from the integrator into an output digital value;
   a digital logic unit in data communication with the digital dither signal and the comparators, the digital logic unit being configured to change the output digital value on the basis of the digital dither signal; and
   a feedback path between an output of the digital logic unit and an input of the integrator.

7. The sigma-delta analog-to-digital converter of claim 6, further comprising a digital-to-analog converter in the feedback path.

* * * * *